United States Patent [19]
Aoyagi et al.

[11] Patent Number: 5,157,681
[45] Date of Patent: Oct. 20, 1992

[54] WAVELENGTH-TUNABLE DISTRIBUTED BRAGG REFLECTOR SEMICONDUCTOR LASER

[75] Inventors: Toshitaka Aoyagi; Satoshi Arimoto, both of Itami, Japan

[73] Assignee: Mitsubishi Denki Kabushiki Kaisha, Japan

[21] Appl. No.: 721,714

[22] Filed: Jun. 26, 1991

[30] Foreign Application Priority Data

Jun. 27, 1990 [JP] Japan .................. 2-170464

[51] Int. Cl.$^5$ ............................. H01S 3/19
[52] U.S. Cl. ........................ 372/50; 372/20; 372/26; 372/96
[58] Field of Search ............. 372/50, 20, 96, 26

[56] References Cited

U.S. PATENT DOCUMENTS

| | | | |
|---|---|---|---|
| 4,719,636 | 1/1988 | Yamaguchi | 372/20 |
| 4,856,005 | 8/1989 | Oe et al. | 372/20 |
| 4,920,542 | 4/1990 | Brosson et al. | 372/96 |
| 4,995,048 | 2/1991 | Kuindersma et al. | 372/20 |
| 5,088,097 | 2/1992 | Ono et al. | 372/20 |

FOREIGN PATENT DOCUMENTS

| | | | |
|---|---|---|---|
| 0079283 | 4/1986 | Japan | 372/96 |
| 0245692 | 10/1987 | Japan | 372/96 |
| 0065189 | 3/1990 | Japan | 372/20 |

OTHER PUBLICATIONS

Woodward et al., "The Side-Mode Suppression Ratio of a Tunable DBR Laser", IEEE Photonics Technology Letters, vol. 2, No. 12, Dec. 1990, pp. 854–856.

*Primary Examiner*—Georgia Y. Epps
*Attorney, Agent, or Firm*—Leydig, Voit & Mayer

[57] ABSTRACT

A wavelength-tunable distributed Bragg reflector semiconductor laser including serially disposed active, phase control, and wavelength tuning sections includes a first conductivity type semiconductor substrate; a first conductivity type semiconductor light guide layer disposed on said substrate at least in the phase control and wavelength tuning sections of the laser including at least one quantum well layer sandwiched between quantum barrier layers; a first conductivity type semiconductor barrier layer and a semiconductor active layer serially disposed on the light guide layer in the active section of the laser; a second conductivity type semiconductor cladding layer disposed on the light guide layer at least in the phase control and wavelength tuning sections of the laser, the light guide layer including a Bragg reflector in the wavelength tuning section of the laser; a first electrode disposed on the substrate; and second, third, and fourth electrodes disposed on the cladding layer in the active, phase control, and wavelength tuning sections of the laser, respectively.

32 Claims, 6 Drawing Sheets

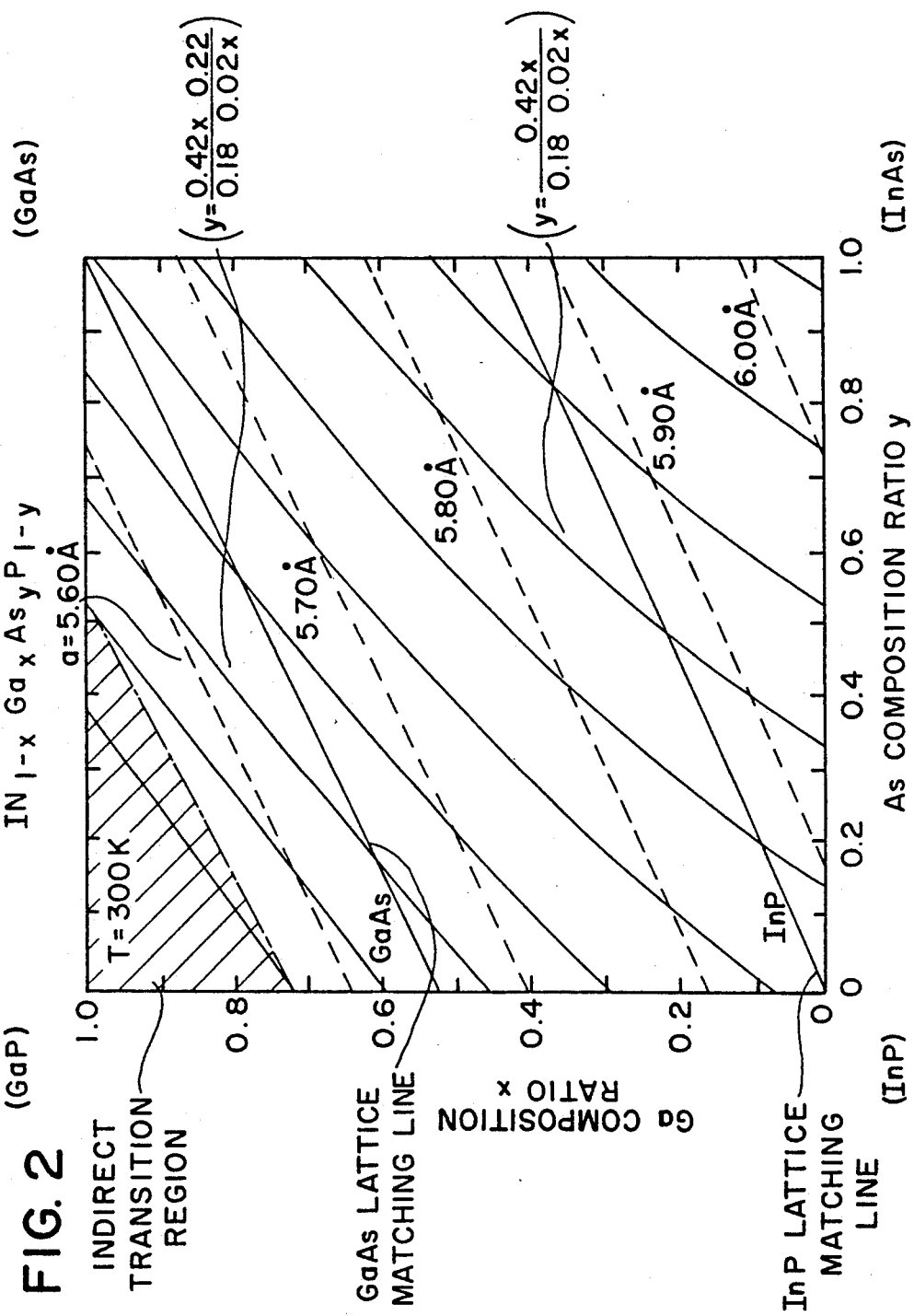

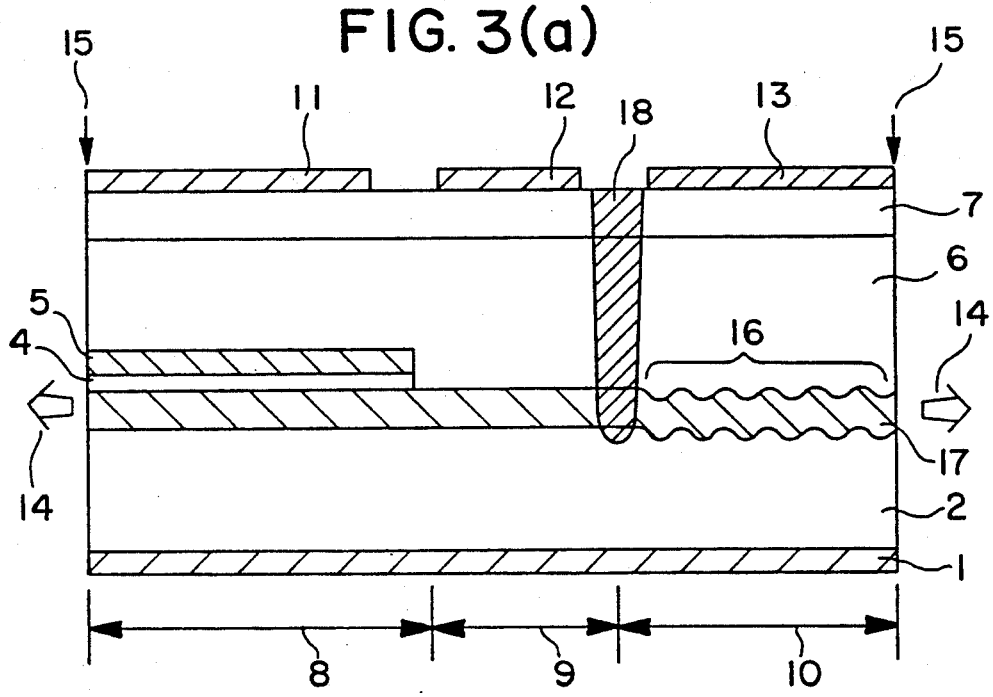
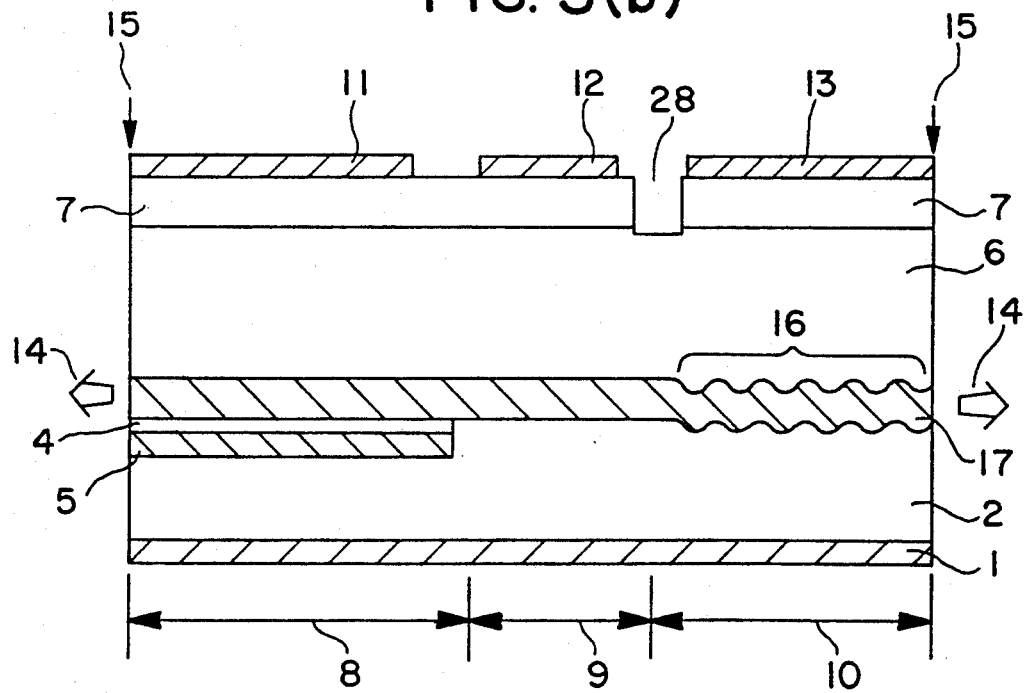

WAVELENGTH-TUNABLE DISTRIBUTED BRAGG REFLECTOR SEMICONDUCTOR LASER

FIELD OF THE INVENTION

The present invention relates to a distributed Bragg reflector (DBR) wavelength-tunable semiconductor laser and, more particularly, to such a laser in which the generation of heat and light in a wavelength tuning section is suppressed.

BACKGROUND OF THE INVENTION

FIG. 5 is a cross-sectional view of a conventional DBR wavelength-tunable semiconductor laser. The laser includes an n-type indium phosphide (InP) substrate 2. In the structure, the substrate 2 also functions as a cladding layer confining light generated in an active layer to light guide layer. In the structure of FIG. 2, an n-type indium gallium arsenide phosphide (InGaAsP) light guide layer 3 is disposed on the cladding layer 2. The semiconductor laser of FIG. 5 includes three serially disposed sections along the common substrate 2 and the light guide layer 3. Those sections are an active section 8, a phase control section 9, and a wavelength tuning section 10. In the laser, an n-type InP barrier layer 4 is disposed on the light guide layer 3 within the active section 8. An InGaAsP active layer 5 is disposed on the barrier layer 4 within the active section 8. A p-type InP cladding layer 6 is disposed on the active layer 5 in the active section 8 and on the light guide layer 3 in the phase control and wavelength tuning sections 9 and 10. A p-type InGaAsP contacting layer 7 is disposed on the cladding layer 6 throughout the active, phase control, and wavelength tuning sections 8, 9, and 10. A common electrode 1 is disposed on the substrate 2. Electrodes 11, 12, and 13 are disposed on the contacting layer 7 in the active phase control, and wavelength tuning sections, respectively.

The laser of FIG. 5 includes opposed facets 15 between which the active, phase control, and wavelength tuning sections 8, 9, and 10 are serially disposed. A diffraction grating structure 16, i.e., a Bragg reflector, is present at the interface of the light guide layer 3 and the cladding layer 6 in the wavelength tuning section 10. In other words, the interface between the light guide layer 3 and the cladding layer 6 is not planar and includes periodic features that interact with light propagating through the light guide layer 3 in the manner of a diffraction grating. In operation, the semiconductor laser generates light in the active layer 5. The light travels in the light guide layer 3, oscillating between and emerging from the respective facets 15 as light beams 14 shown in FIG. 5.

In the operation of the semiconductor laser of FIG. 5, a positive voltage bias is applied to each of the electrodes 11, 12, and 13 with respect to the common electrode 1. By employing separate electrodes, the amount of current flowing within each of the sections of the laser transverse to the layers can be controlled and the wavelength of light produced by the laser can be tuned, i.e., controlled, over a range of wavelengths. When a forward bias voltage is applied across the electrodes 11 and 1, i.e., in the active section 8, holes and electrons are injected into the active layer 5, producing light. The light propagates from the active layer 5 to the light guide layer 3 which has a lower index of refraction than the active layer 5 and a higher index of refraction than the substrate 2 and the cladding layer 6 for confining the light within the light guide layer 3. The light oscillates within the light guide layer 3 between the facets 15. When sufficient current flows between the electrodes 11 and 1, i.e., when the current threshold of the laser is exceeded, laser oscillation occurs and the light beams 14 are monochromatic.

At the same time light is being produced at the active layer 5, the diffraction grating 16, i.e., the Bragg reflector, interacts with the light propagating within the light guide layer 3 and reflects a predetermined wavelength of that light with a higher efficiency than light of other wavelengths. The forward bias voltage applied between the electrodes 13 and 1 causes charge carriers to be injected into the Bragg reflector structure 16 in the wavelength tuning section and decreases the refractive index locally because of the plasma produced by the injected charge carriers. As a result, the wavelength that is reflected with highest efficiency by the Bragg reflector structure 16 is shifted toward shorter wavelengths with increasing forward bias. In other words, the wavelength of the light emitted by the laser of FIG. 5 can be altered by changing the voltage bias applied between the electrodes 13 and 1, i.e., in the wavelength tuning section.

In order to optimize the light output at the selected wavelength, the phases of the light propagating in the light guide layer 3 in the active section and in the wavelength tuning section are matched by controlling the current flowing between the electrodes 12 and 1 in the phase control section 9. The voltage bias applied across the electrodes 12 and 1 is determined by observing the light output of the laser and adjusting the voltage bias to maximize the light output.

Although most of the light output of the laser of FIG. 5 is produced in the active layer 5, because each of the phase control and wavelength tuning sections 9 and 10 includes pn junctions that are forward biased, additional light output occurs in each of those sections. This light output is detrimental and can interfere with the propagation of the light that is generated in the active layer 5. In addition, because the current flow in the forward biased junction in the wavelength tuning section is relatively high, considerable heat is generated in that section during operation of the laser. The resulting temperature rise limits the light output of the laser and/or contributes to premature failure of the laser.

SUMMARY OF THE INVENTION

It is an object of the invention to provide a wavelength-tunable DBR semiconductor laser in which undesired light emission and heat generation are suppressed in the wavelength tuning section of the laser structure.

According to one aspect of the invention, a wavelength-tunable distributed Bragg reflector semiconductor laser including serially disposed active, phase control, and wavelength tuning sections comprises a first conductivity type semiconductor substrate; a first conductivity type semiconductor light guide layer disposed on said substrate at least in the phase control and wavelength tuning sections of the laser and including at least one quantum well layer having a first energy band gap sandwiched between quantum barrier layers having a second energy band gap larger than the first energy band gap; a first conductivity type semiconductor barrier layer and a semiconductor active layer serially disposed on the light guide layer in the active section of the laser; a second conductivity type semiconductor cladding layer disposed on the light guide layer at least in the phase control and wavelength tuning sections of the laser, the light guide layer including a Bragg reflector in the wavelength tuning section of the laser; a first electrode disposed on the substrate; and second, third, and fourth electrodes disposed on the cladding layer in the active, phase control, and wavelength tuning sections of the laser, respectively.

According to another aspect of the invention, a wavelength-tunable distributed Bragg reflector semiconductor laser including serially disposed active, phase control, and wavelength tuning sections comprises a first conductivity type semiconductor substrate; a first conductivity type semiconductor light guide layer disposed on the substrate at least in the phase control and wavelength tuning sections of the laser; a first conductivity type semiconductor barrier layer disposed on the light guide layer at least in the phase control and wavelength tuning sections of the laser and including at least one quantum well having a first energy band gap sandwiched between quantum barrier layers having a second energy band gap larger than the first energy band gap, the light guide layer including a Bragg reflector in the wavelength tuning section of the laser; a semiconductor active layer disposed on the barrier layer in the active section of the laser; a second conductivity type semiconductor cladding layer disposed on one of the light guide layer and the barrier layer at least in the phase control and wavelength tuning sections of the laser; a first electrode disposed on the substrate; and second, third, and fourth electrodes disposed on the cladding layer in the active, phase control, and wavelength tuning sections of the laser, respectively.

Other objects and advantages of the present invention will become apparent from the detailed description given hereinafter. The detailed description of specific embodiments is given by way of illustration only, since various additions and modifications within the spirit and scope of the invention will become apparent to those of skill in the art from the detailed description.

BRIEF DESCRIPTION OF THE DRAWINGS

FIG. 2 is a graph of the lattice constant and energy band gap of $In_{1-x}Ga_xAs_yP_{1-y}$ as a function of x and y.

FIGS. 3(a) and 3(b) are cross-sectional views of a wavelength-tunable/DBR semiconductor lasers in accordance with embodiments of the invention.

DETAILED DESCRIPTION OF PREFERRED EMBODIMENTS

Figure 1A:
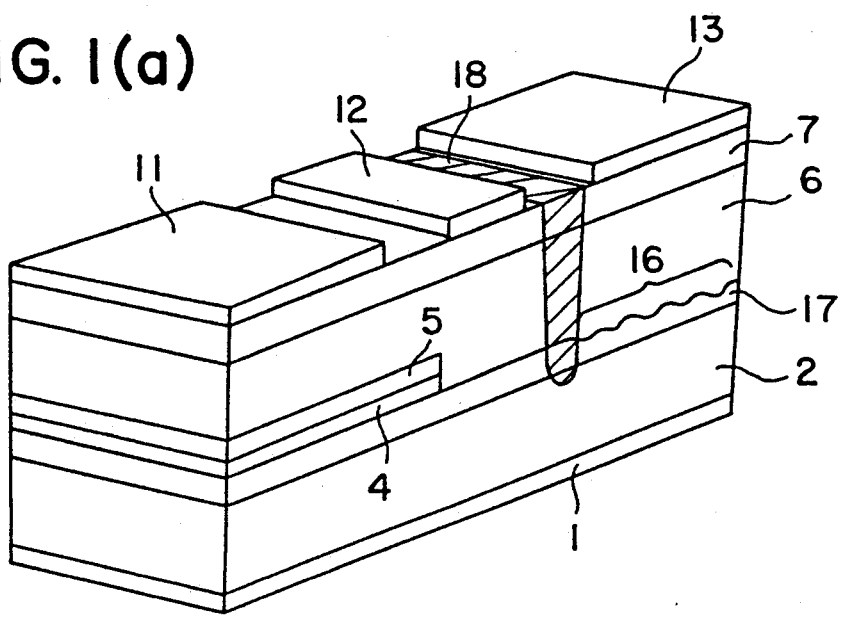
FIGS. 1(a) and 1(b) are a perspective view and a cross-sectional view, respectively, of a wavelength-tunable DBR semiconductor laser in accordance with an embodiment of the invention.

An embodiment of a wavelength-tunable DBR semiconductor laser according to the invention is shown in perspective and cross-sectional views in FIGS. 1(a) and (b), respectively. In these and the other figures, the same elements are given the same reference numbers as those already described for FIG. 5. Accordingly, it is not necessary to again describe those elements. In the laser structure of FIGS. 1(a) and 1(b), an n-type light guide layer 17 replaces the light guide layer 3 of the structure of FIG. 5. The light guide layer 17 is a quantum well structure, i.e., a semiconductor quantum well layer, sandwiched between semiconductor quantum barrier layers. Most preferably, the light guide layer 17 is a multiple quantum well structure including a plurality of quantum well layers disposed between respective pairs of quantum barrier layers.

The quantum well structure of the light guide layer 17 may be grown using conventional techniques, such as metal organic chemical vapor deposition (MOCVD) or molecular beam epitaxy (MBE). The quantum barrier layers with their higher energy band gaps are deposited alternatingly with the lower energy band gap quantum well layer or layers. In a structure according to the invention, using the same materials described for the laser structure of FIG. 5, the quantum well layer may be $In_{1-x}Ga_xAs_yP_{1-y}$ and the quantum barrier layer may be $In_{1-u}Ga_uAs_vP_{1-v}$ where $y>v>0$. In this structure, the active layer 5 is $In_{1-w}Ga_wAs_zP_{1-z}$. In order for the light guide layer 17 to receive and confine light generated in the active layer 5, $z>y>v>0$. In this arrangement, the active layer 5 has the lowest energy band gap of the materials in the laser. The substrate 2, the barrier layer 4, and the cladding layer 6 have the same energy band gap, the highest energy band gap of the materials in the laser. The energy band gaps of the quantum well layers and of the quantum barrier layers are intermediate the energy band gaps of the cladding layer 6 and the active layer 5. In this structure, the equivalent refractive index of the light guide 17 is sufficiently high to confine and guide the light produced in the active layer 5, the effective energy band gap of the light guide layer 17 is high enough to avoid significant absorption of that light, and charge carriers are confined much less in the light guide layer 17 than in active layer 5 so that undesired and unintentional light emission is suppressed.

After the growth of the quantum well structure or multiple quantum well structure of light guide layer 17, the diffraction grating structure 16 is formed by conventional technology. For example, using photolithography, a photoresist is deposited on the light guide layer 17 in the wavelength tuning section 10, exposed to interference fringes of light, developed as a mask with a periodic structure, layer 17 is etched through the mask, and the mask is removed.

Figure 1B:
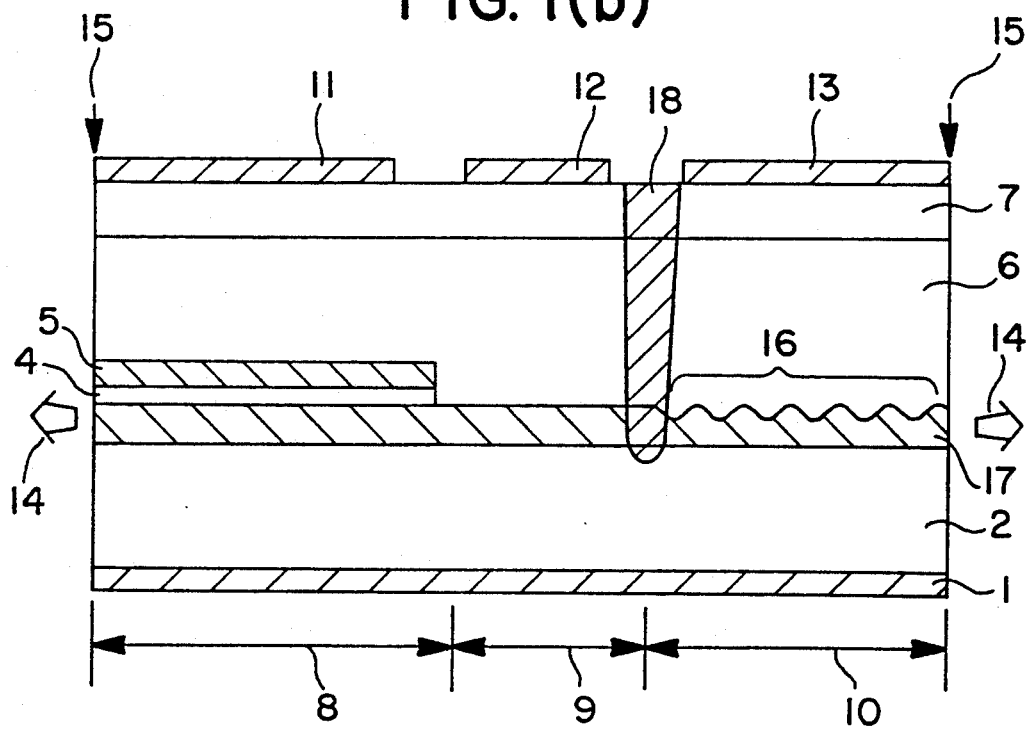
Figure 5:
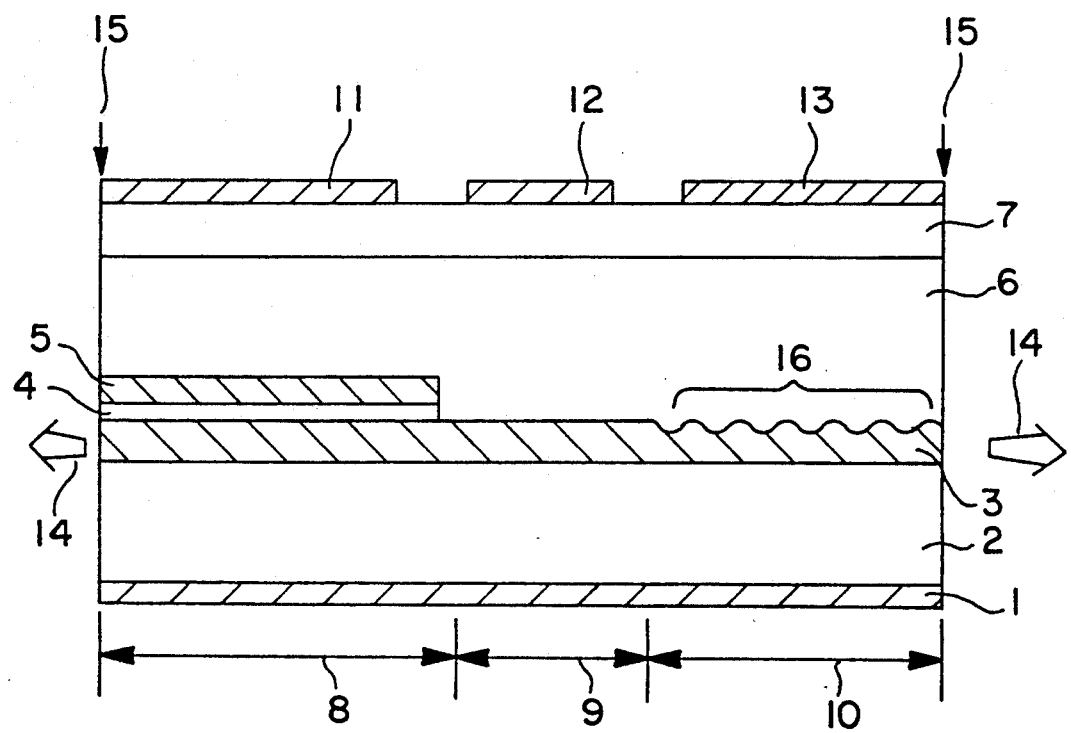
FIG. 5 is a cross-sectional view of a conventional wavelength-tunable DBR semiconductor laser.

In the embodiment of the invention according to FIGS. 1(a) and 1(b), using the semiconductor materials described with respect to FIGS. 5 and 1(b), it is important that the adjacent layers have lattice constants that are substantially the same. Otherwise, it is difficult to epitaxially grow the light guide layer 17 and the layers subsequently grown. FIG. 2 is a graph of the lattice constant and energy band gap of $In_{1-x}Ga_xAs_yP_{1-y}$ as a function of x and y. When the substrate 2 is InP, the quantum well, quantum barrier, and active layers should have very nearly the same lattice constants as InP. It is assumed, for this embodiment, that cladding layer 6 and the barrier layer 4 are both InP. As shown in FIG. 2, the lattice constant of $In_{1-x}Ga_xAs_yP_{1-y}$ equals that of InP when y is approximately equal to (0.42x)/(0.18+0.02x). Thus, for the specific example of the embodiment of FIG. 1(b) discussed above, $z>y>v>0$, $y$ is approximately equal to $(0.42x)/(0.18+0.02x)$, $v$ is approximately equal to $(0.42u)/(0.18+0.02u)$, and $z$ is approximately equal to $(0.42w)/(0.18+0.02w)$.

The semiconductor laser of FIGS. 1(a) and 1(b) includes a high resistivity, i.e., insulating, region 18 disposed between the electrode 12 and 13, i.e., between the phase control section 9 and the wavelength tuning section 10. The insulating region 18 extends through the contacting layer 7, the cladding layer 6, the light guide layer 17, and into the substrate 2. The insulating region 18 electrically isolates the phase control section 9 from the wavelength tuning section 10 without optically isolating the sections 9 and 10 from each other. In other words, light propagating through the light guide layer 17 is not significantly affected by the insulating region 18 although that region provides electrical isolation between the sections 9 and 10. Insulating region 18 is formed by the implantation of ions, preferably protons, in a step that may employ the electrodes 12 and 13 as self-aligning ion implantation masks. Insulating region 18 may also be formed by implanting ions of oxygen or of another atom. The isolating region 18 extends at least through the contacting layer 7, the cladding layer 6, and into the light guide layer 17. The isolating region 18 need not extend into the substrate 2, as shown in FIG. 1(b), to be effective.

The insulating region 18 prevents undesired current flows between the electrode 13 and the electrodes 11 and 12. As an alternative to the insulating region 18, a portion of the contacting layer 7 may be removed between the electrodes 12 and 13, leaving the gap 28 shown in FIG. 1(c). The gap 28 in the contacting layer 7 eliminates a low impedance path between the electrode 13 and the electrodes 11 and 12 that exists when the contacting layer 7 is present between the electrodes 12 and 13 if the insulating region 18 is not present. The gap 28 may be formed by masking and etching the contacting layer 7, preferably in conjunction with the processing forming the electrodes 12 and 13.

Figure 1C:
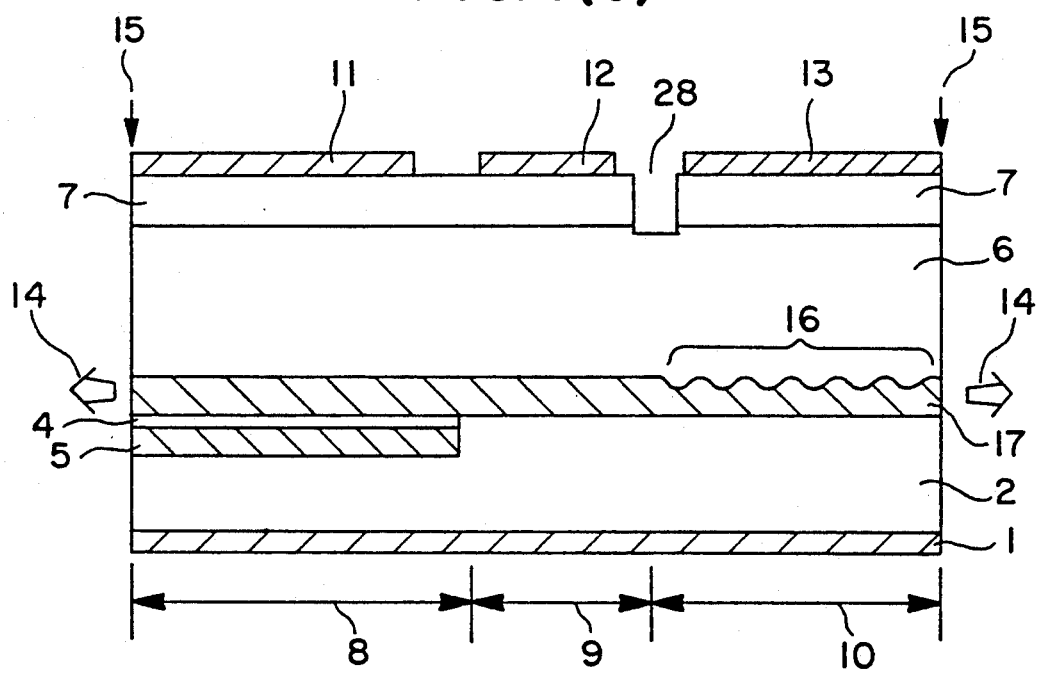
FIG. 1(c) is an alternative embodiment of a wavelength-tunable DBR semiconductor laser in accordance with the invention.

In the embodiment of the invention shown in FIGS. 1(a) and 1(b), the barrier layer 4 and the active layer 5 are disposed between the cladding layer 6 and the light guide layer 17. However, the position of the barrier layer 4 and the active layer 5 can be reversed relative to the light guide layer 17, i.e., so that the barrier layer 4 and the active layer 5 are disposed between the light guide layer 17 and the substrate 2 in the active section of the laser, as shown in FIG. 1(c). The embodiment of FIG. 1(b) may be altered within the scope of the invention by replacing the insulation region 18 with the gap 28 in the contacting layer 7 or by reversing the position of the barrier layer 4 and the active layer 5 relative to the light guide layer 17 without making both changes.

The laser embodiments of FIGS. 1(a), 1(b), and 1(c) are operated in a significantly different way from the semiconductor laser of FIG. 5. The electrical isolation of the phase control section 9 and the wavelength tuning section 10 makes it easy to reverse bias the wavelength tuning section 10 while forward biasing the active section 8 and the phase control section 9. When a reverse bias voltage is applied across the electrodes 1 and 13, most of that voltage appears across the pn junction at the interface between the cladding layer 6 and the light guide layer 17. Because the light guide layer 17 has a quantum well structure, its refractive index changes significantly with the magnitude of the applied reverse bias voltage. As a result, the wavelength of the light generated in the laser can be tuned over a significant range by varying the reverse bias voltage applied to the wavelength tuning section 10. In addition, because the pn junction at the Bragg reflector 16 is reverse biased, relatively little current flows between the electrodes 13 and 1, particularly compared to the amount of current that flows when the junction of the laser of FIG. 5 is forward biased. Light emission in the wavelength tuning section 10 is suppressed by the reverse biasing of the junction and the amount of power dissipated in the wavelength tuning section 10 is significantly reduced compared to the laser of FIG. 5. Thus, relatively little heat is generated in the wavelength tuning section 10, permitting increased light generation without raising the temperature of the laser which might cause premature failure.

Unlike the laser of the invention, the laser of FIG. 5 cannot function if the wavelength tuning section 10 is reverse biased. The laser of FIG. 5 depends upon the charge carrier plasma injected into the region adjacent the pn junction between the light guide layer 3 and the cladding layer 6 to alter the refractive index of the light guide layer 3 and thereby tune the wavelength of the light produced by the laser. If that junction in the laser structure of FIG. 5 is reverse biased, the plasma effect does not occur because charge carriers are not injected into the region adjacent the pn junction. By contrast, in the invention, since the light guide layer 17 is a quantum well structure, the effective refractive index of the light guide layer 17 and the wavelength tuning section 10 is a strong function of the reverse bias voltage applied across the electrodes 13 and 1.

Another embodiment of the invention is shown in a cross-sectional view in FIG. 3(a). The structure of FIG. 3(a) is identical to that of FIG. 1(b) except that two diffraction grating structures, i.e., Bragg reflectors, are present in the wavelength tuning section 10. As in the structure of FIG. 1(b), one Bragg reflector is present at the interface between the cladding layer 6 and the light guide layer 17. In addition, in FIG. 3(a), a second grating structure is present at the interface between the light guide layer 17 and the substrate 2. This structure is achieved by etching a periodic pattern into the surface of the substrate 2 in the wavelength tuning section 10 before the quantum well structure of the light guide layer 17 is deposited. Again, that periodic structure on the substrate may be formed by conventional technology, as previously described. When the thin layers of a multiple quantum well structure forming the light guide layer 17 are grown, the pattern of the Bragg reflector in the substrate 2 is maintained and a second such pattern appears at the interface between the cladding layer 6 and the light guide layer 17. The patterns of the two reflectors are in phase with each other because the pattern of the Bragg reflector that is first formed in carried through to the second reflector in the multiple quantum well structure layer growth process.

The semiconductor laser of FIG. 3(a) is operated in the same manner already discussed for the semiconductor laser of FIG. 1(b) and produces the same advantages. The second Bragg reflector, preferably in phase with the first Bragg reflector, provides sensitive wavelength tuning control. Like the embodiments of the invention shown in FIGS. 1(b) and 1(c), the positions of the barrier layer 4 and the active layer 5 in the embodiment of FIG. 3(a) can be reversed relative to the light guide layer 17, as shown in FIG. 3(b). In other words, the barrier layer 4 and the active layer 5 can be sandwiched between the substrate 2 and the light guide layer 17 in the active section of the laser. In addition, a gap 28, shown in FIG. 3(b), in the contacting layer 7 between the electrodes 12 and 13 may be employed in place of the isolating region 18.

Figure 4A:
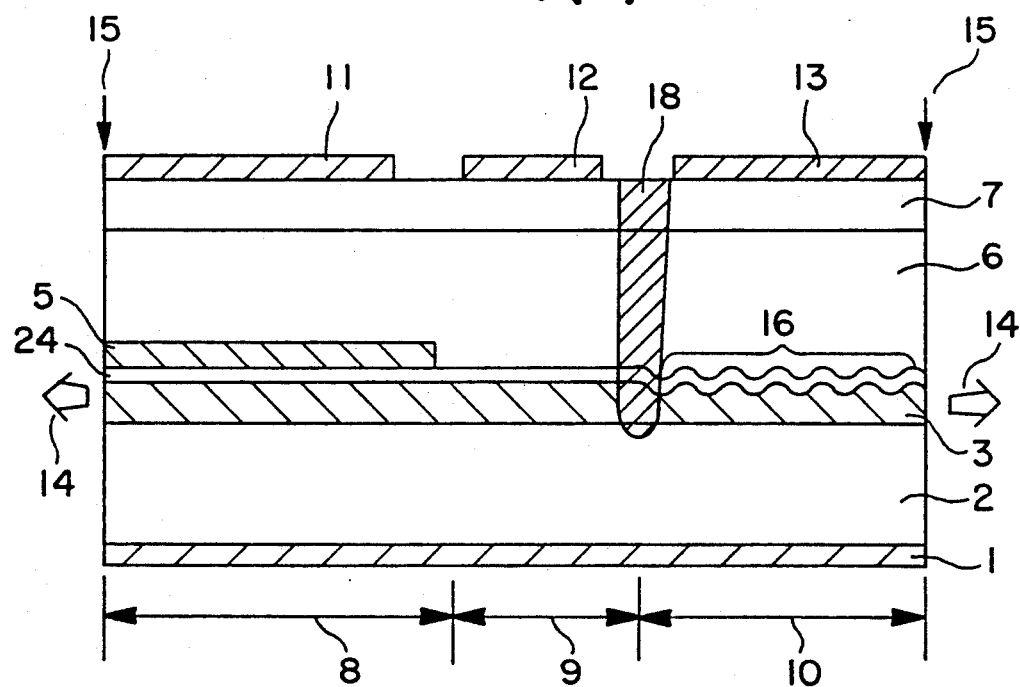
FIGS. 4(a) and 4(b) are cross-sectional views of wavelength-tunable DBR semiconductor lasers in accordance with embodiments of the invention.

Yet another embodiment of a tunable DBR semiconductor laser is shown in cross-section in FIG. 4(a). Unlike the other embodiments of the invention described, in the structure of FIG. 4(a) the light guide layer 3 is a homogeneous layer, for example, of InGaAsP, as in the laser of FIG. 5. However, in the embodiment of FIG. 4(a), the barrier layer 4 of the laser of FIG. 5 is replaced by a barrier layer 24 that extends through the active, phase control, and wavelength tuning sections 8, 9, and 10. The barrier layer 24 is a quantum well or multiple quantum well structure and includes two distributed Bragg reflectors within the wavelength tuning section 10. The first of those reflectors is present at the interface between the light guide layer 3 and the barrier layer 24 and the second is present at the interface of the barrier layer 24 and the cladding layer 6. The Bragg reflector 16 is formed using the same processing techniques already described and, therefore, the two reflectors are in phase with each other. The embodiment of the invention shown in FIG. 4(a) operates in the same way and provides the same advantages achieved by the other embodiments previously described.

Figure 4B:
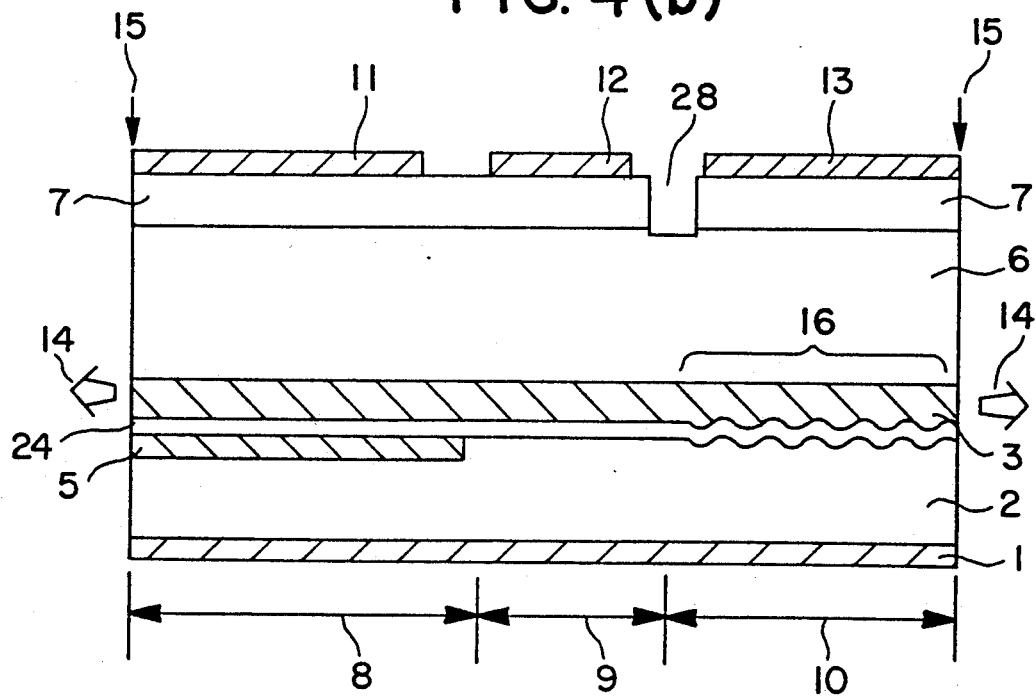

In an alternative to the embodiment of FIG. 4(a), the barrier layer 24 may be disposed between the substrate 2 and the light guide layer 3. In that case, the active layer 5 is sandwiched between the substrate 2 and the barrier layer 24 in the active section of the laser, as shown in FIG. 4(b). The laser embodiment of FIG. 4(b) also includes a gap 28 in the contacting layer 7 between the electrodes 12 and 13 in place of the isolating region 18 of the embodiment of FIG. 4(a). One or both of the differences between the embodiments of FIGS. 4(a) and 4(b) can be incorporated into a laser according to the invention.

While embodiments of the invention have been described as employing InP and InGaAsP, other semiconductor materials, for example, based on GaAs and InGaAsP, may be employed. The In and Ga concentrations in the InGaAsP that provide lattice matches with GaAs are shown in FIG. 2.

We claim:

1. A wavelength-tunable distributed Bragg reflector semiconductor laser including serially disposed active, phase control, and wavelength tuning sections comprising:
   a first conductivity type semiconductor substrate;
   a first conductivity type semiconductor light guide layer disposed on said substrate at least in the phase control and wavelength tuning sections of the laser and including at least one quantum well layer having a first energy band gap sandwiched between quantum barrier layers having a second energy band gap larger than the first energy band gap;
   a first conductivity type semiconductor barrier layer and a semiconductor active layer serially disposed on the light guide layer in the active section of the laser;
   a second conductivity type semiconductor cladding layer disposed on the light guide layer at least in the phase control and wavelength tuning sections of the laser, the light guide layer including a Bragg reflector in the wavelength tuning section of the laser;
   a first electrode disposed on the substrate; and
   second, third, and fourth electrodes disposed on the cladding layer in the active, phase control, and wavelength tuning sections of the laser, respectively.

2. The semiconductor laser of claim 1 including an insulating region extending through the cladding layer and into the light guide layer between the third and fourth electrodes, electrically isolating the phase control and wavelength tuning sections of the laser from each other.

3. The semiconductor laser of claim 2 including a second conductivity type contacting layer interposed between and in contact with the cladding layer and the second, third, and fourth electrodes wherein the insulating region extends through the contacting layer between the third and fourth electrodes.

4. The semiconductor laser of claim 2 wherein the insulating region is formed by ion implantation employing the third and fourth electrodes as implantation masks.

5. The semiconductor laser of claim 4 wherein the insulating region is formed by implantation of one of protons and oxygen ions.

6. The semiconductor laser of claim 1 including a second conductivity type contacting layer interposed between and respectively in contact with the cladding layer and each of the second, third, and fourth electrodes without providing a current path between the fourth electrode and the second and third electrodes through the contacting layer.

7. The semiconductor laser of claim 1 wherein the Bragg reflector is formed between the cladding layer and the light guide layer and including a second Bragg reflector formed between the substrate and light guide layer in the wavelength tuning section of the laser, the two Bragg reflectors being in phase with each other.

8. The semiconductor laser of claim 1 wherein the light guide layer is a multiple quantum well structure.

9. The semiconductor laser of claim 1 wherein the substrate, barrier layer, and cladding layer are InP, the quantum well layer is $In_{1-x}Ga_xAs_yP_{1-y}$, the quantum barrier layers are $In_{1-u}Ga_uAs_vP_{1-v}$, and the active layer is $In_{1-w}Ga_wAs_zP_{1-z}$ where $z > y > v > 0$.

10. The semiconductor laser of claim 9 wherein the substrate, the quantum barrier layers, the quantum well layer, the barrier layer, the active layer, and the cladding layer all have substantially the same lattice constant.

11. The semiconductor laser of claim 1 wherein the active layer is sandwiched between the cladding layer and the barrier layer and the cladding layer is disposed on the active layer in the active section of the laser.

12. The semiconductor laser of claim 1 wherein the active layer is sandwiched between the substrate and the barrier layer in the active section of the laser and the cladding layer is disposed on the light guide layer in the active section of the laser.

13. A wavelength-tunable distributed Bragg reflector semiconductor laser including serially disposed active, phase control, and wavelength tuning sections comprising:
   a first conductivity type semiconductor substrate;
   a first conductivity type semiconductor light guide layer disposed on the substrate at least in the phase control and wavelength tuning sections of the laser;

a first conductivity type semiconductor barrier layer disposed on the light guide layer at least in the phase control and wavelength tuning sections of the laser and including at least one quantum well having a first energy band gap sandwiched between quantum barrier layers having a second energy band gap larger than the first energy band gap, the light guide layer including a Bragg reflector in the wavelength tuning section of the laser;

a semiconductor active layer disposed on the barrier layer in the active section of the laser;

a second conductivity type semiconductor cladding layer disposed on one of the light guide layer and the barrier layer at least in the phase control and wavelength tuning sections of the laser;

a first electrode disposed on the substrate; and second, third, and fourth electrodes disposed on the cladding layer in the active, phase control, and wavelength tuning sections of the laser, respectively.

14. The semiconductor laser of claim 13 including an insulating region extending through the cladding layer and into the light guide layer between the third and fourth electrodes, electrically isolating the phase control and wavelength tuning sections of the laser from each other.

15. The semiconductor laser of claim 14 including a second conductivity type contacting layer interposed between and in contact with the cladding layer and the second, third, and fourth electrodes wherein the insulating region extends through the contacting layer between the third and fourth electrodes.

16. The semiconductor laser of claim 14 wherein the insulating region is formed by ion implantation employing the third and fourth electrodes as implantation masks.

17. The semiconductor laser of claim 16 wherein the isolating region is formed by implantation of one of protons and oxygen ions.

18. The semiconductor laser of claim 13 including a second conductivity type contacting layer interposed between and respectively in contact with the cladding layer and each of the second, third, and fourth electrodes without providing a current path between the fourth electrode and the second and third electrodes through the contacting layer.

19. The semiconductor laser of claim 13 wherein the Bragg reflector is formed between the barrier layer and the light guide layer and including a second Bragg reflector formed between the cladding layer and the barrier layer in the wavelength tuning section of the laser, the two Bragg reflectors being in phase with each other.

20. The semiconductor laser of claim 13 wherein the barrier layer is a multiple quantum well structure.

21. The semiconductor laser of claim 13 wherein the substrate, the quantum barrier layers, the quantum well layer, the light guide layer, the active layer, and the cladding layer all have substantially the same lattice constant.

22. The semiconductor laser of claim 13 wherein the active layer is sandwiched between the cladding layer and the barrier layer in the active section of the laser and the cladding layer is disposed on the barrier layer in the phase control and wavelength tuning sections of the laser of the laser.

23. The semiconductor laser of claim 13 wherein the cladding layer is disposed on the light guide layer in the active, phase control, and wavelength tuning sections and the active layer is sandwiched between the substrate and the barrier layer in the active section of the laser.

24. A wavelength tunable distributed Bragg reflector semiconductor laser including serially disposed, active, phase control, and wavelength tuning sections comprising:

a semiconductor light guide layer, having an index of refraction, extending through the active, phase control, and wavelength tuning sections of the laser, including a Bragg reflector in the wavelength tuning section of the laser, and having a quantum well structure;

a semiconductor active layer disposed on the light guide layer in the active section of the laser;

first and second cladding layers of opposite conductivity types sandwiching the light guide layer and the active layer in the active, phase control, and wavelength tuning sections of the laser; and first and second electrodes in contact with the first and second cladding layers, respectively, in the active section of the laser and a third electrode in contact with the first cladding layer in the wavelength tuning section of the laser for applying a reverse bias voltage across the light guide layer in the wavelength tuning section of the laser to control the index of refraction of the light guide layer in the wavelength tuning section of the laser and thereby to control the wavelength of light reflected by the Bragg reflector in the wavelength tuning section of the laser.

25. The semiconductor laser of claim 24 wherein one of the first and second cladding layers is a substrate.

26. The semiconductor laser of claim 24 including an insulating region extending through one of the first and second cladding layers and into the light guide layer between the first and third electrodes, electrically isolating the phase control and wavelength tuning sections of the laser from each other.

27. The semiconductor laser of claim 26 including a contacting layer interposed between and in contact with the first cladding layer and the first and third electrodes wherein the insulating region extends through the contacting layer between the first and third electrodes.

28. The semiconductor laser of claim 24 including a contacting layer interposed between and respectively in contact with the first cladding layer and each of the first and third electrodes without providing a current path between the first and third electrodes through the contacting layer.

29. The semiconductor laser of claim 24 wherein the Bragg reflector is formed between the first cladding layer and the light guide layer and including a second Bragg reflector formed between the second cladding layer and the light guide layer in the wavelength tuning section of the laser, the two Bragg reflectors being in phase with each other.

30. The semiconductor laser of claim 24 wherein the light guide layer is a multiple quantum well structure.

31. The semiconductor laser of claim 24 wherein the first and second cladding layers are InP, the quantum well structure includes at least one quantum well layer sandwiched by quantum barrier layers, the quantum well layer is $In_{1-x}Ga_xAs_yP_{1-y}$, the quantum barrier layers are $In_{1-u}Ga_uAs_vP_{1-v}$, and the active layer is $In_{1-w}Ga_wAs_zP_{1-z}$ where $z > y > v > 0$.

32. The semiconductor laser of claim 31 wherein the first and second cladding layers, the quantum barrier layers, the quantum well layer, and the active layer all have substantially the same lattice constant.

* * * * *